United States Patent [19]
Anderson et al.

[11] Patent Number: 5,793,822
[45] Date of Patent: Aug. 11, 1998

[54] BIST JITTER TOLERANCE MEASUREMENT TECHNIQUE

[75] Inventors: Michael B. Anderson; Philip A. Atkinson, both of Colorado Springs, Colo.

[73] Assignee: Symbios, Inc., Fort Collins, Colo.

[21] Appl. No.: 543,767

[22] Filed: Oct. 16, 1995

[51] Int. Cl.$^6$ .................................................. H04L 7/00
[52] U.S. Cl. .......................... 375/371; 375/376; 375/226; 455/67.4
[58] Field of Search ........................ 375/371, 226, 375/373, 374, 375, 376; 455/67.1, 67.4, 333

[56] References Cited

U.S. PATENT DOCUMENTS

| | | | |
|---|---|---|---|
| 3,496,536 | 2/1970 | Wheeler et al. | 340/146.1 |
| 3,546,588 | 12/1970 | Campbell | 325/42 |
| 3,889,109 | 6/1975 | Blessin | 235/153 |
| 4,112,264 | 9/1978 | Abramson et al. | 179/175.3 |
| 4,534,036 | 8/1985 | Betts et al. | 375/10 |
| 5,239,535 | 8/1993 | Borth et al. | 370/13 |
| 5,309,428 | 5/1994 | Copley et al. | 370/17 |
| 5,515,404 | 5/1996 | Pearce | 375/371 |

*Primary Examiner*—Don N. Vo
*Attorney, Agent, or Firm*—Duke W. Yee; Wayne P. Bailey

[57] ABSTRACT

A circuit in a semiconductor device for testing jitter tolerance of a receiver in the semiconductor device. The circuit includes a jitter injection circuit that has an output connected to an input in a phase-locked loop circuit. The jitter injection circuit generates an output signal in response to an application of an input signal. The phase-locked loop circuit has an output that generates a clock signal, wherein the clock signal may be altered by the output signal from the jitter injection circuit. The clock signal from the phase-locked loop circuit controls transmission of data at the transmitter. Alteration of the clock signal caused by the jitter injection circuit alters the manner in which the transmitter transmits data.

23 Claims, 9 Drawing Sheets

BIST JITTER TOLERANCE MEASUREMENT TECHNIQUE

BACKGROUND OF THE INVENTION

1. Technical Field

The present invention relates generally to communications systems and in particular to a method and apparatus for testing jitter in a communications network. Still more particularly, the present invention relates to a method and apparatus for testing sensitivity of a receiver in a semiconductor device to jitter using a circuit located within the semiconductor device.

2. Description of the Related Art

Services such as voice mail, video on demand, and voice activated accessing of information from remote text and video libraries across the country are being made available through various broadband technologies. These services are made available through components such as Synchronous Optical Network (SONET), Asynchronous Transfer Mode (ATM) and Intelligent Networks (IN) that make up broadband communications. Other services include computer serial I/O data channels such as Fibre Channel, Serial Storage Architecture (SSA), and P1394. These services are provided through a communications network containing a system of interconnected facilities designed to carry traffic from a variety of telecommunications sources. A "network" includes nodes and links. "Nodes" are typically switching offices, junction pairs, or both. "Links" represent cable, terminating equipment, etc. "Traffic" is information within the network that flows through the nodes and links. With the introduction of more sophisticated services involving the transfer of large amounts of information data, such as digital data video, or voice data, communications networks must provide certain levels of performance. More information on broadband communications may be found in Kumar, *Broad Band Communications: A Professional's Guide to ATM, Frame Relay, SMDS, SONET, and BISDN*, McGraw-Hill, Inc. (1995).

As speeds of serial data links and communication networks increase, jitter becomes a more critical issue. "Jitter" is a term which refers to a type of signal distortion in serial data communications. More specifically, jitter can be described as incidental phase modulation measured as a time deviation. Typical bit error rates (BER) are acceptable to an order of $10^{-12}$. Transmitters with low jitter output and sensitive receivers are required in serial data links to achieve acceptable levels of BER in communication networks. Typically, jitter tolerance requires specially designed test equipment requiring tester and lab characterization time. To test transmitter receiver systems on semiconductor devices, expensive test equipment and increased amounts of test time is required for testing these devices. Therefore, it would be advantageous to have a method and apparatus to reduce testing costs and testing time for transmitter and receiver systems on semiconductor devices.

SUMMARY OF THE INVENTION

The present invention provides a circuit in a semiconductor device for testing tolerance of a receiver in the semiconductor device to jitter. The invention includes a jitter injection circuit that has an output connected to an input in a phase-locked loop circuit. The jitter injection circuit generates an output signal at the output in response to an application of an input signal at the input. The phase-locked loop circuit has an output that generates a clock signal, wherein the clock signal may be altered by the output signal from the jitter injection circuit. The clock signal from the phase-locked loop circuit controls transmission of data at the transmitter. Alteration of the clock signal caused by the jitter injection circuit alters the manner in which the transmitter transmits data. In particular, the phase and/or frequency at which the transmitter transmits data is altered.

The transmitter is connected to a receiver using a transmission medium. Transmitted data is compared to the received data to determine whether errors have occurred in response to an alteration of the transmission of data caused by the jitter injection circuit.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

Figure 1:
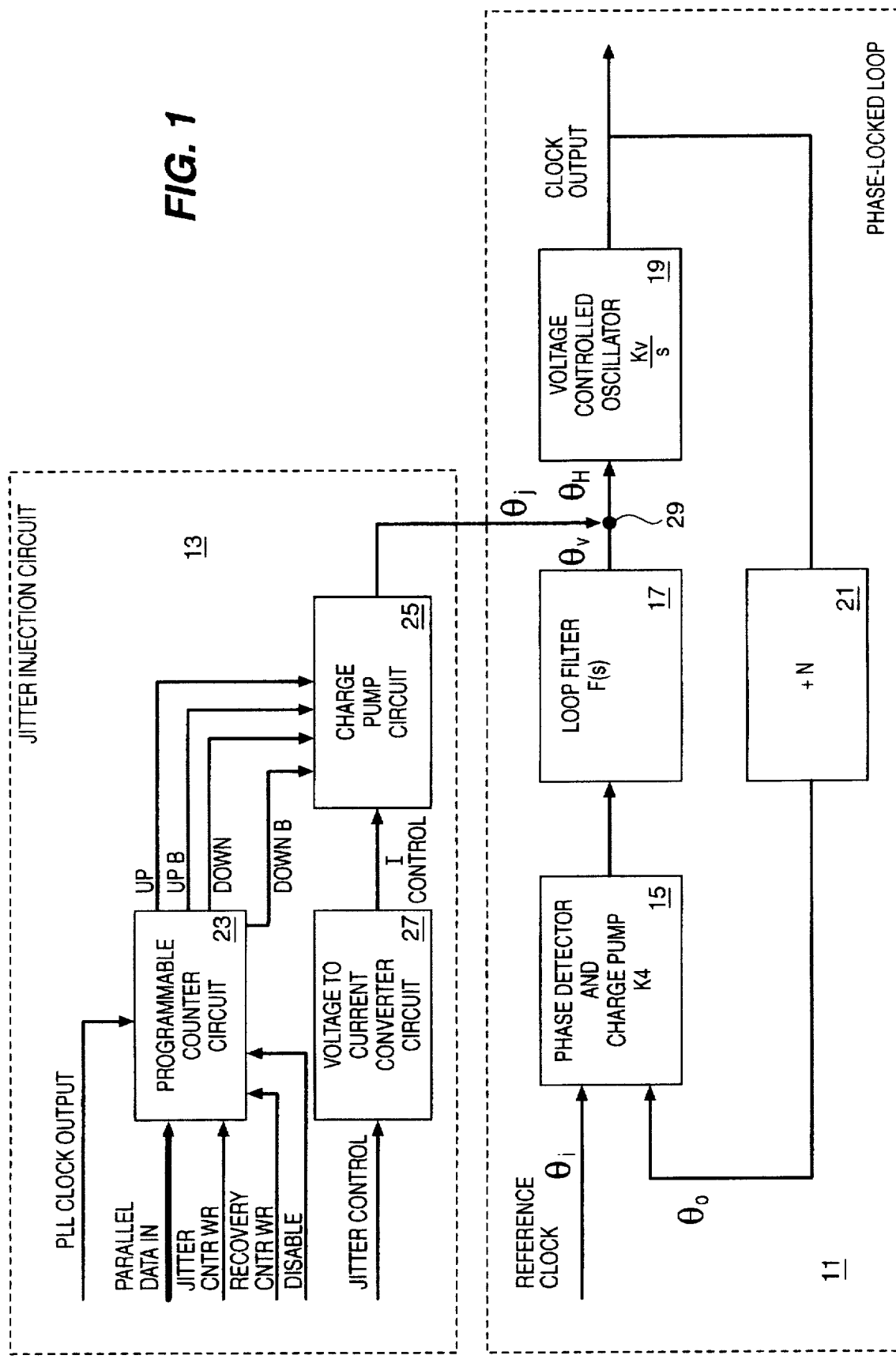
FIG. 1 is a block diagram of a phase-locked loop circuit and a jitter injection circuit according to the present invention.

With reference now to the figures, and in particular with reference to FIG. 1, a block diagram of a phase-locked loop circuit (PLL) 11 and a jitter injection circuit 13 according to the present invention. PLL 11 includes a phase detector and charge pump 15, a loop filter 17, a voltage controlled oscillator 19, and a divide by N circuit 21. The operation of PLL 11 is well known in the art and more information as to its function may be found in Best, *Phase-Locked Loop: Theory, Design, and Applications*, McGraw-Hill, Inc., (2nd ed. 1993). Jitter injection circuit 13 includes a programmable counter circuit 23, a charge pump circuit 25, and a voltage to current converter circuit 27.

The output of charge pump circuit 25 is connected to node 29, leading to the input of voltage controlled oscillator 19 in PLL 11. Loop filter 17 has an output connected to node 29. Loop filter 17 ideally inputs a DC voltage into voltage controlled oscillator 19, which responds to changes in voltage levels by shifting frequency and/or phase. Any voltage change at node 29 caused by charge pump circuit 25 will effect the output phase and/or frequency. Jitter injection circuit 13 injects current into node 29 using charge pump circuit 25, modulating voltage controlled oscillator 19 and creating jitter in the output of PLL 11.

The following analysis shows that the optimum jitter injection point has been selected in FIG. 1, and that the loop dynamics prove that the jitter injection circuit will induce jitter across a broad spectrum of frequencies.

A preferred jitter injection input must be considered. There are several options to chose from. The two options that are apparent are the input of the loop filter and the input of the VCO. The input of the VCO can be shown to be the preferred injection point.

Still, referring to FIG. 1, superposition can be applied to PLL 11 using Laplace notation and assuming a linear system. Here $\theta_i$, is the reference input, $\theta_j$ is the jitter injection signal, and $\theta_o$ is the output phase. Applying superposition, $\theta_i$ can be ignored and three equations can be written as follows:

$$\theta_\mu = \theta_r + \theta_j$$

$$\theta_r = \theta_o K_d F(s)$$

$$\theta_o = \theta_\mu \frac{K_v}{sN}$$

The second two equations can be substituted into the first equation resulting in the following closed loop relationship between the output phase and the input jitter.

$$G(s) = \frac{\theta_o}{\theta_j} = \frac{K_v}{sN - K_v K_d F(s)}$$

Figure 2:
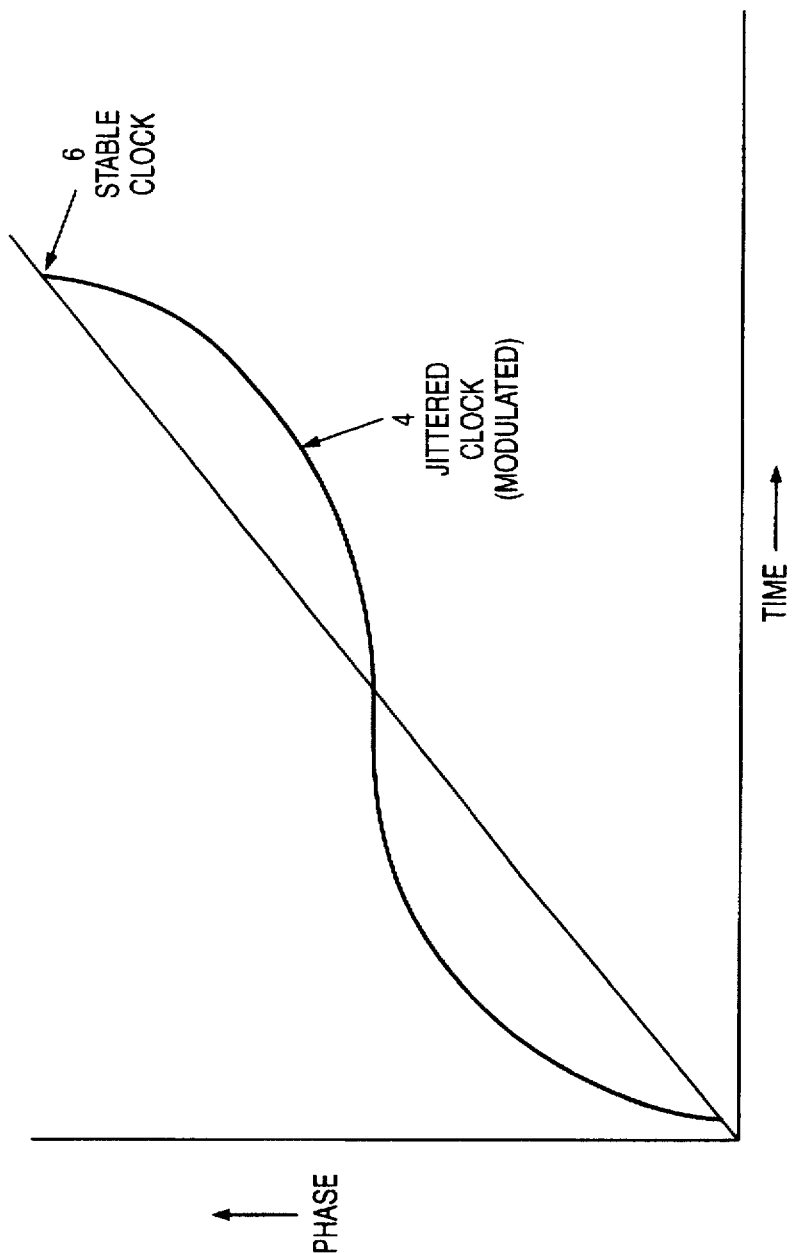
FIG. 2 is an example of sinusoidal jitter modulation.

This equation describes the closed loop dynamics which can be characterized as a wide band low pass filter/amplifier. This invention point yields the broadest response exceeding the PLL crossover frequency. FIG. 2 shows a phase progression plot which illustrates sinusoidal jitter modulation. In this figure, the horizontal axis is time and the vertical axis is phase. Ideally, a perfect clock signal will have no jitter resulting in a straight line, stable clock line 6 with a positive slope equal to the frequency. A jittered clock line 4 would deviate from stable clock line 6 as shown. The non-ideal case shown in FIG. 2 depicts an example of sinusoidal jitter modulation.

Figure 3:
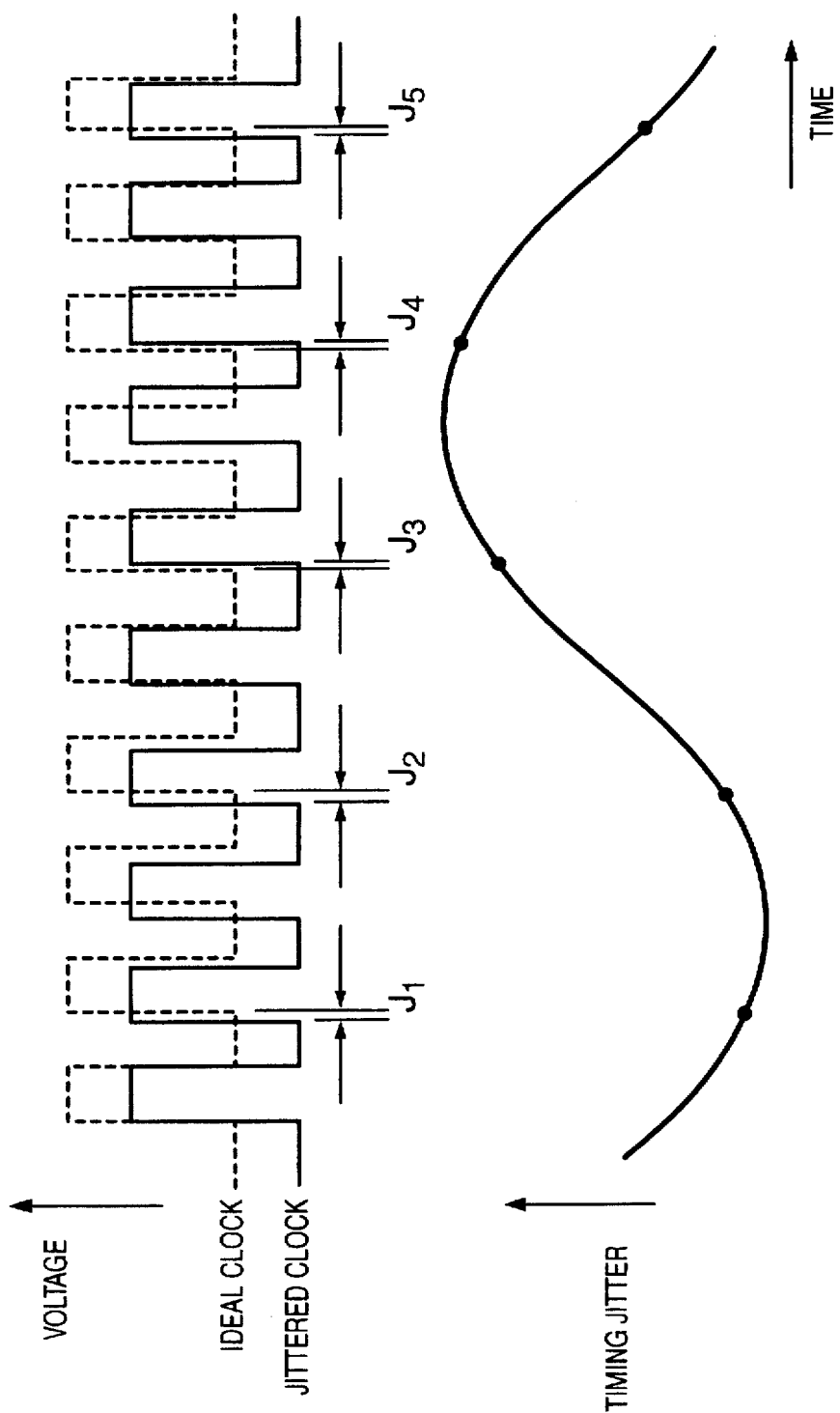
FIG. 3 is an illustration of the concept of sinusoidal jitter caused by sinusoidal jitter modulation.

Sinusoidal jitter modulation consists of injecting a discrete frequency sinusoid into the PLL. FIG. 3 illustrates the concept of sinusoidal jitter caused by sinusoidal jitter modulation. The phase periodically shifts about a stable reference. The jitter injection circuit can be used to create sinusoidal jitter modulation by asserting the modulate pin (shown in FIG. 4) and stimulating the jitter control pin (shown in FIG. 4) with a sinusoid. The amplitude of the sinusoid varies the amount of current into node 29 through transistor T4 in FIG. 7 by modulating the voltage to current converter and mirroring the current to transistor T2. Transistors T3, T6, and T7 are off in this mode.

Sinusoidal jitter modulation is helpful to measure the loop dynamics of the receiver by incrementally sweeping the frequency of the input jitter.

Phase step modulation consists of periodically injecting one pulse of charge into node 29 (shown in FIG. 1) every N bit times where N is large enough that the loop will settle to a steady state before injecting another pulse. This will cause the clock to abruptly shift and recover. This type of modulation causes phase step jitter that is used to measure the phase step jitter tolerance of the receiver. An alternate method consists of injecting one charge pulse and then removing the same amount of charge before the loop can respond. The jitter injection circuit can accomplish this type of jitter with the proper programming of the programmable counter circuit. Both sinusoidal jitter and phase step jitter involve altering the phase and/or frequency at which the transmitter transmits data.

Turning back to jitter injection circuit 13, voltage to current converter circuit 27 is controlled by a jitter control signal, which sets the level of current to be injected into node 29 leading to the input of voltage controlled oscillator 19. Programmable counter circuit 23 allows charge pump circuit 25 to inject current repeatedly into or out of node 29. For example, charge pump circuit 23 might (1) pump current into voltage controlled oscillator 19 for five successive clock cycles, (2) not pump into the node for ten clock cycles, and (3) then draw current away from voltage controlled oscillator 19 for five successive clock cycles. Charge pump circuit 25 is essentially a variable current source and sink with electronically controlled switches.

Figure 4:
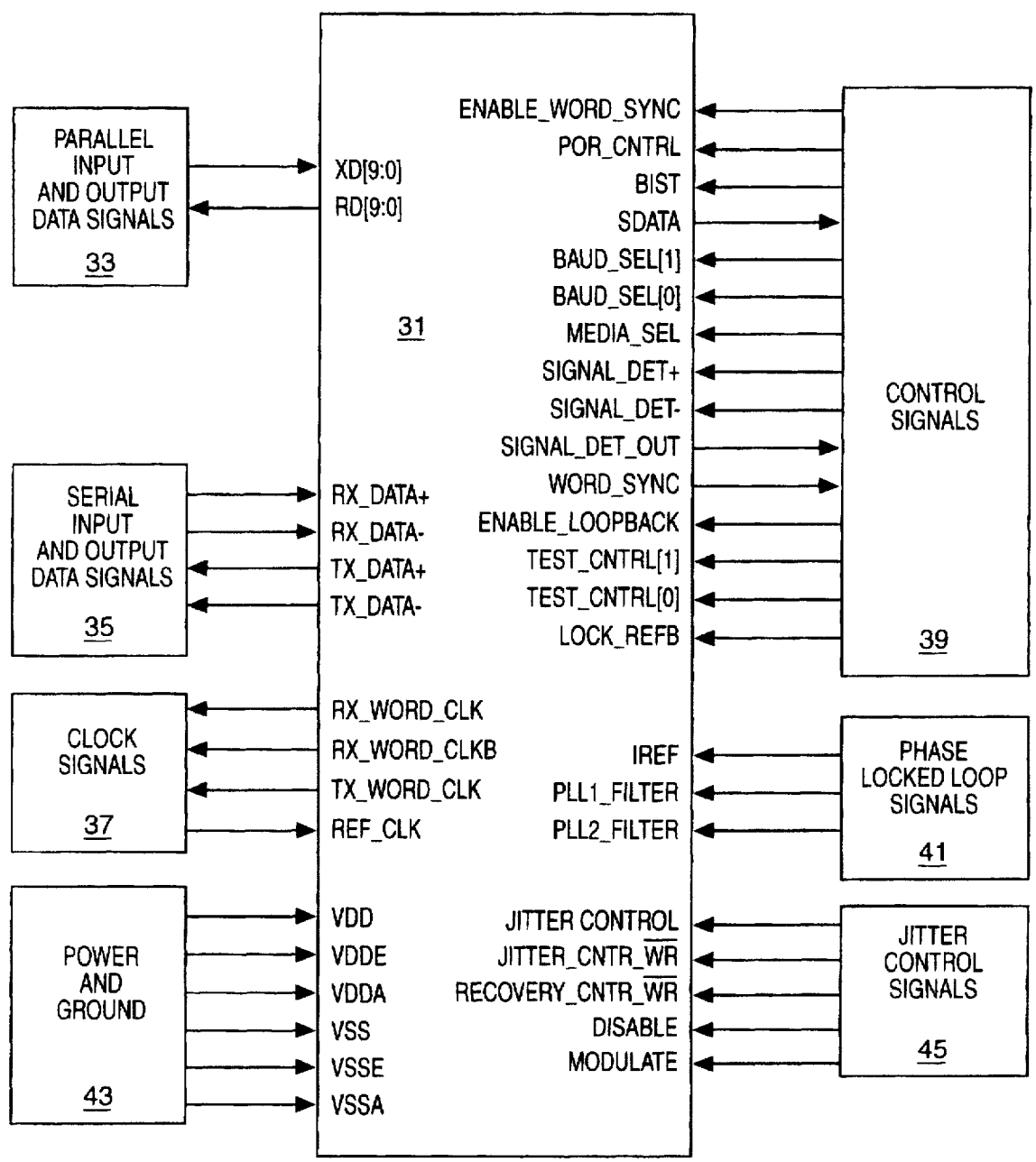
FIG. 4 is a block diagram showing a chip level pinout according to the present invention.

Turning now to FIG. 4, a block diagram showing a chip level pinout is depicted according to the present invention. Chip 31 includes a number of pins for various signals, such as parallel input and output data signals 33, serial input and output data signals 35, clock signals 37, control signals 39, and PLL signals 41. Chip 31 also includes power and ground pins to receive power and ground signals 43. These particular pinouts are examples of typical pinouts and may vary according to the particular implementation. Jitter control pins are pins employed to receive jitter control signals 45, according to the present invention, for testing jitter in a receiver located within chip 31.

Figure 5:
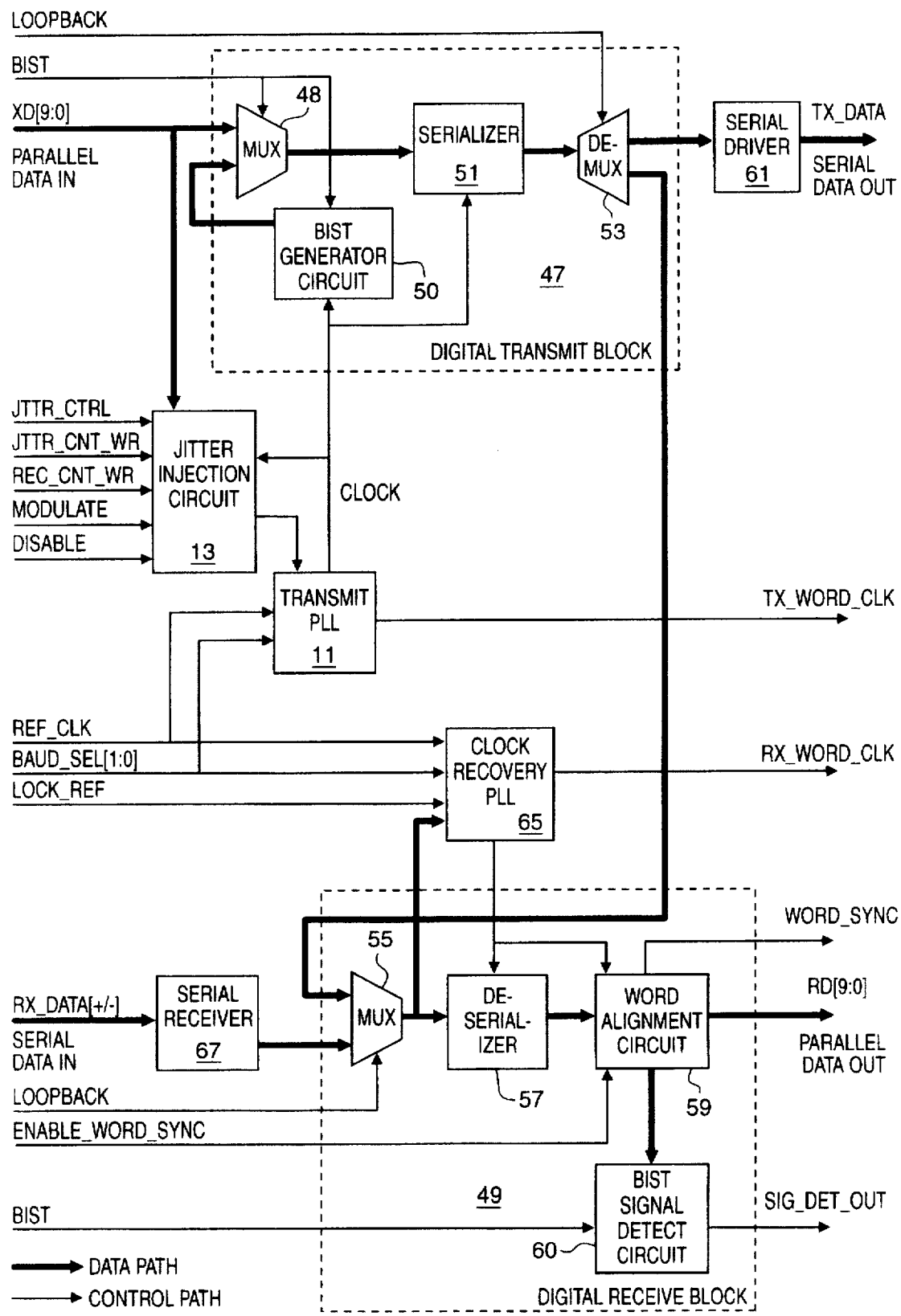
FIG. 5 is a block diagram of a transmitter, receiver, jitter injection, and other associated circuitry according to the present invention.

Turning now to FIG. 5, a block diagram of a transmitter, receiver, jitter injection, and other associated circuitry are depicted according to the present invention. As can be seen with reference to FIG. 3, chip 31 includes transmitter 47 and receiver 49. Transmitter 47 includes a multiplexer 48, a Built In Self Test (BIST) generator circuit 50, a serializer 51, and a de-multiplexer 53 while receiver 49 includes a multiplexer 55, a de-serializer 57, a word alignment circuit 59, and a BIST signal detect circuit 60. Chip 31 also includes jitter injection circuit 13 and PLL 11, such as those shown in FIG. 1, in the semiconductor device in chip 31. De-multiplexer 53 in transmitter 47 has an output connected to serial driver 61, which in turn provides a serial data output, TX_DATA[+/-] for chip 31. Receiver 49 has a clock recovery PLL 65 that is used to drive de-serializer 57 and word alignment circuit 59. Multiplexer 55 in receiver 49 includes an input for serial data received by serial receiver 67. Multiplexer 55 also includes an input from de-multiplexer 53. Except for jitter injection circuit 13 and its connections to PLL 11 and the control inputs and parallel data input, the remaining blocks are typical of those for transmitters and receivers known in the art. Additionally, other circuits not shown may be found within chip 31 according to the present invention.

Still referring to FIG. 5, the clock signal generated by PLL 11 and sent to serializer 51 is altered or controlled by jitter injection circuit 13. The altered or jittered clock signals are sent into transmitter 47 causing jitter in the serialized data sent through the serial driver 61. The jitter alters the phase and/or frequency transmission of the serialized data. This jittered output at pin TX_DATA[+/-] is sent through a transmission medium such as cable which leads back to pin RX_DATA[+/-] to serial receiver 67, resulting in a serial to parallel conversion of data at receiver 49 with the data being sent back out at pin RD [9:0]. The output of transmitter 47 at pin TX_DATA[+/−] is the point where jitter is normally measured. At this point, jitter can be empirically measured to calibrate the amount of jitter created by jitter circuit 13. Also, at this point, the jittered output signal is sent from pin TX_DATA[+/−] through a transmission medium, such as coaxial cable, to receiver 49 via pin RX_DATA[+/−].

In either case, jitter generated by jitter injection circuit 13 is received by receiver 49. The parallel output data at pin RD[9:0] is compared to the parallel input data sent in at pin XD[9:0] for errors. Such a compare function may be accomplished on chip 31 or off chip 31. This type of comparison may be implemented in many ways known to those of ordinary skill in the art. For example, a string of comparator circuits may be employed to compare parallel data in and out of chip 31. By adjusting the amount of jitter created by jitter injection circuit 13, jitter tolerance receiver 49 can be determined by increasing jitter until an error is detected in the parallel data sent out of pins RD[9:0] or by using an internal compare circuit.

In some cases, an internal loopback is present where transmitter drivers are bypassed internally. In the depicted example, generator circuit 50 is a circuit that is known to those of ordinary skill in the art and is employed to generate parallel data to be serialized. This data is routed from multiplexer 48 and serialized by serializer 51 when a BIST signal is applied to this generator 50 and multiplexer 48. A LOOPBACK signal causes de-multiplexer 53 To send data to multiplexer 55. This data is de-serialized and placed in parallel form by de-serializer 57.

Thereafter, data is sent from word alignment circuit 59 to BIST signal detect circuit 60. This circuit is also well known to those of ordinary skill in the art and is employed to detect whether an error has occurred in transmission. BIST signal detect circuit 60 generates a signal SIG_DET_OUT. An absence of this signal indicates that an error has occurred. According to the present invention, the testing may occur continuously or at selected times using BIST generator circuit 50 and BIST signal detect circuit 60. Typically, when these circuits are enabled, data is not taken from the normal inputs, but is routed internally within the circuit for testing circuit purposes.

Figure 6:
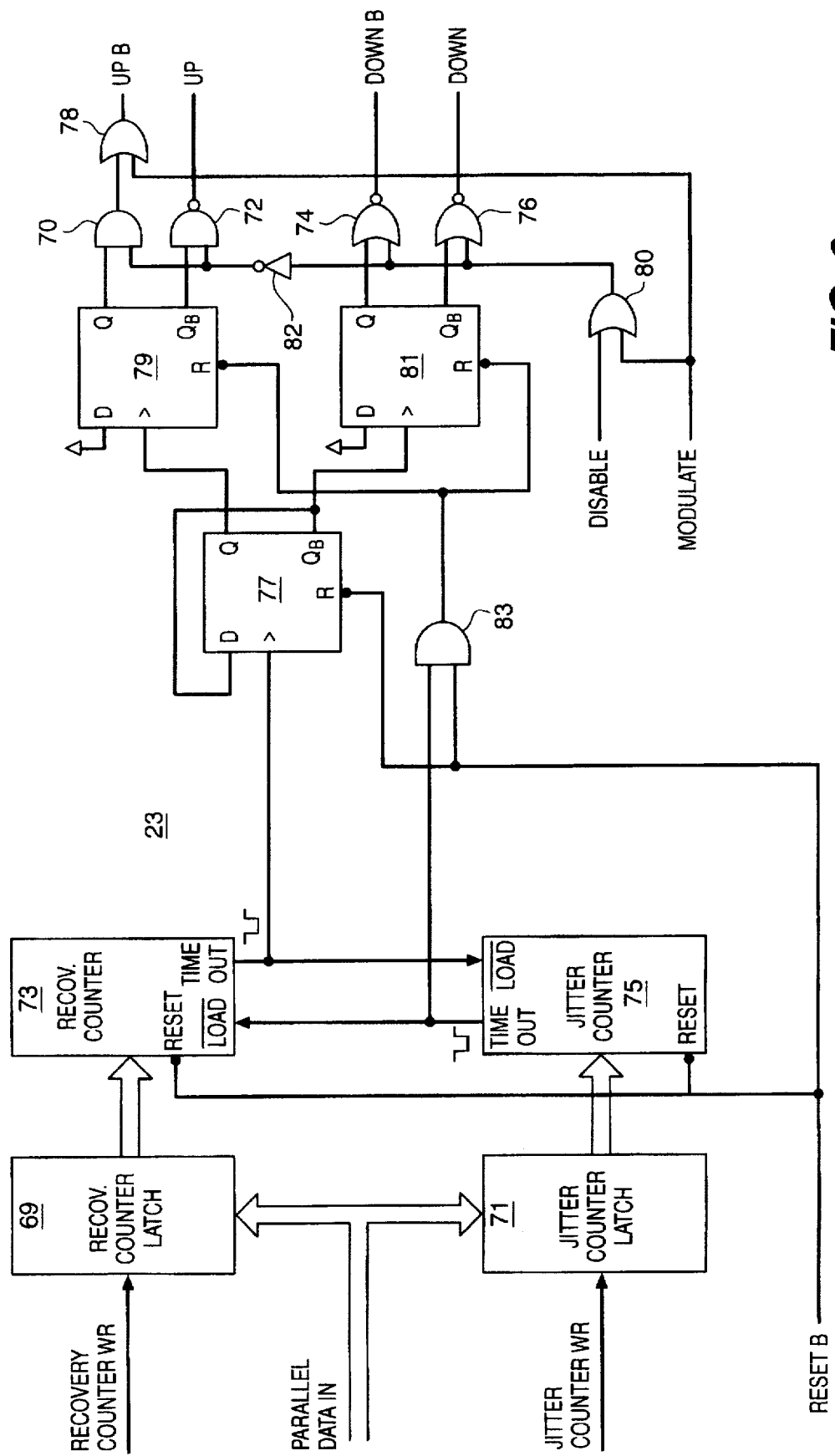
FIG. 6 is a block diagram of programmable counter circuit from FIG. 1 according to the present invention.

Turning now to FIG. 6, a block diagram of programmable counter circuit 23 from FIG. 1 is depicted according to the present invention. Programmable counter circuit 23 includes recovery counter latch 69, jitter counter latch 71, recovery counter 73, and jitter counter 75. Programmable counter circuit 23 also includes D flip-flop 77, D flip-flop 79, D flip-flop 81, and AND gate 83. Parallel data is sent into recovery counter latch 69 and jitter counter latch 71. These latches are controlled by signals RECOVERY COUNTER WR and JITTER COUNTER WR. Parallel data is latched into recovery counter 73 and jitter counter 75. These counters may be reset by the SIGNAL RESET. The output from recovery counter 73 is sent into D flip-flop 77, which has outputs connected to D flip-flops 79 and 81. Recovery counter 73 has a $\overline{\text{LOAD}}$ input connected to the TIME OUT output of jitter counter 75. Jitter counter 75 has a $\overline{\text{LOAD}}$ input connected to the TIME OUT output of recovery counter 73. The TIME OUT output of jitter counter 75 also is connected to AND gate 83, which also has a connection to signal reset. D flip-flops 79 and 81 are controlled by AND gate 83 while D flip-flop 77 is controlled by signal RESET. Latches 79 and 81 generate UP, UPB, DOWN, and DOWNB signals used to control charge pump circuit 25 in FIG. 1.

These signals are enabled and disabled using AND gate 70, NAND gate 72, NOR gates 74–78, OR gate 80, and inverter 82. The input of AND gate 70 and NAND gate 72 are connected to a DISABLE or a MODULATE signal that is inverted by inverter 78 and OR gate 80. NOR gates 74 and 76 are connected to the DISABLE or MODULATE signal by OR gate 80. This signal is employed to enable and disable the outputs from latches 79 and 81. A DISABLE signal results in all of the outputs from D flip flops 79 and 81 being disabled. The use of a MODULATE signal results in all of the outputs from latches 79 and 81 being disabled except for UPB. A MODULATE signal is employed to create sinusoidal jitter according to the present invention. This is done in conjunction with applying selected signals to voltage to current converter circuit 27 as will be described further below.

Figure 7:
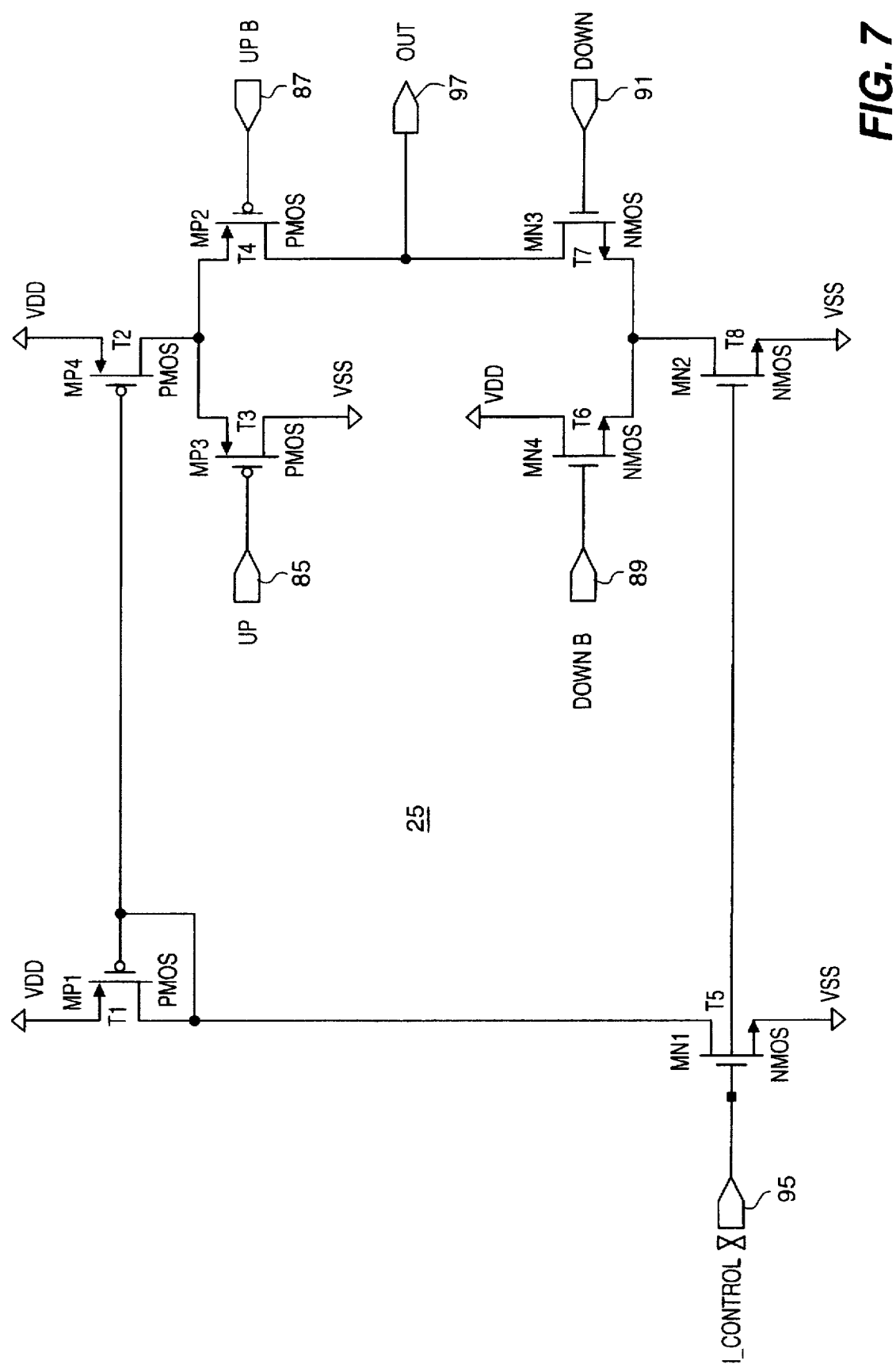
FIG. 7 is a schematic diagram of a charge pump circuit from FIG. 1 according to the present invention.

Turning now to FIG. 7, a schematic diagram of charge pump circuit 25 is depicted according to the present invention. Charge pump circuit 25 includes transistors T1–T8. Transistors T1–T4 are P-channel metal oxide semiconductor (PMOS) transistors while transistors T5–T8 are N-channel metal oxide semiconductor (NMOS) transistors. Transistors T1 and T2 have sources connected to power supply voltage VDD while transistors T5 and T8 have sources connected to power supply voltage VSS. Transistor T3 has a drain connected to power supply voltage VSS while transistor T6 has a drain connected to power voltage VDD. Typically, power supply voltage VDD is at a higher voltage level than power supply voltage VSS.

The gate of transistor T3 is controlled by signal UP applied to input 85 while the gate of transistor T4 is controlled by signal UPB applied to input 87. The gate of transistor T6 is controlled by signal DOWNB applied to input 89 while the gate of transistor T7 is controlled by signal DOWN applied to input 91. These control signals are generated by programmable counter circuit 23 as shown in FIG. 6. Transistors T5 and T8 have gates connected to input 95, which receives signal I_CONTROL from the output of voltage to current converter circuit 27 as described in more detail below in FIG. 8. These various control signals cause current to be sent out or drawn into charge pump circuit 25 at output 97.

Transistor T1 and transistor T5 serves as a current mirror for transistor T2 based on signal I_CONTROL. Transistors T2 and T8 serve as current sources while transistors T3, T4, T6, and T7 serve as switches to connect these current sources to voltage control oscillator 19 in PLL 11.

Figure 8:
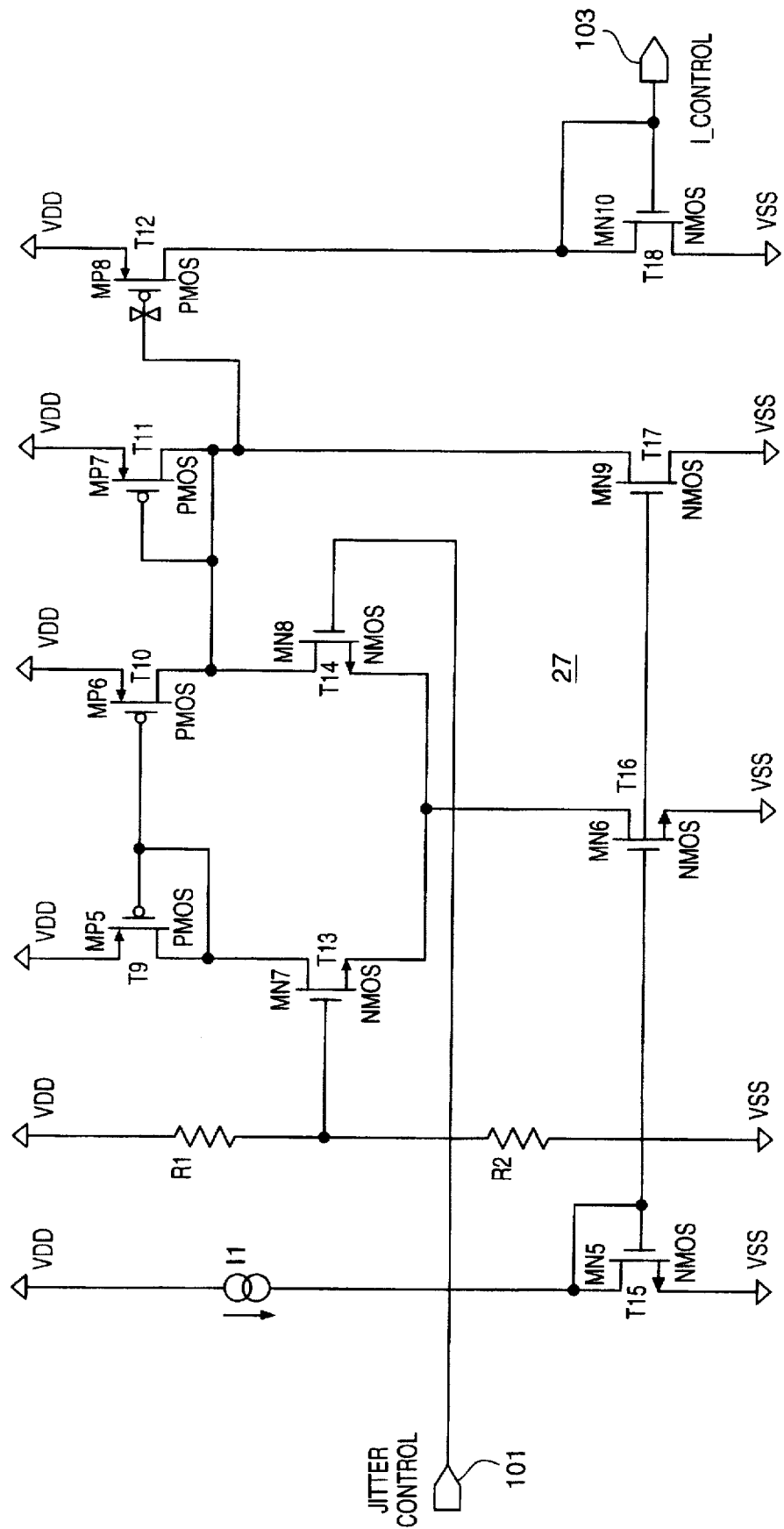
FIG. 8 is a schematic diagram of voltage to a current converter circuit from FIG. 1 according to the present invention.

Turning now to FIG. 8, a schematic diagram of voltage to current converter circuit 27 from FIG. 1 is illustrated according to the present invention. Voltage to current converter circuit 27 includes transistors T9–T18, resistors R1–R2, and current source I1. Transistors T9–T12 are PMOS transistors while transistors T13–T18 are NMOS transistors. Transistors T9–T12 have sources connected to power supply voltage VDD while transistors T15–T18 have sources connected to power supply voltage VSS.

Resistor R1 and resistor R2 are connected in series with resistor R1 having a connection to power supply voltage VDD while resistor R2 having a connection to power supply voltage VSS. Current source I1 is connected to power supply voltage VDD and has a connection to the drain of transistor of T15. The gate of transistor T14 is controlled by signal JITTER CONTROL at input 101. Signal I_CONTROL is generated at output 103. Voltage to current converter circuit 27 is a typical voltage to current converter circuit and may be implemented in other ways than those depicted in FIG. 8.

When sinusoidal jitter is desired, the JITTER CONTROL signal at input 101 is modulated or altered such that the signal I_CONTROL varies in a sinusoidal manner causing the current pumped into the phase-locked loop to vary sinusoidally, resulting in sinusoidal jitter being applied to the transmitter.

Figure 9A:
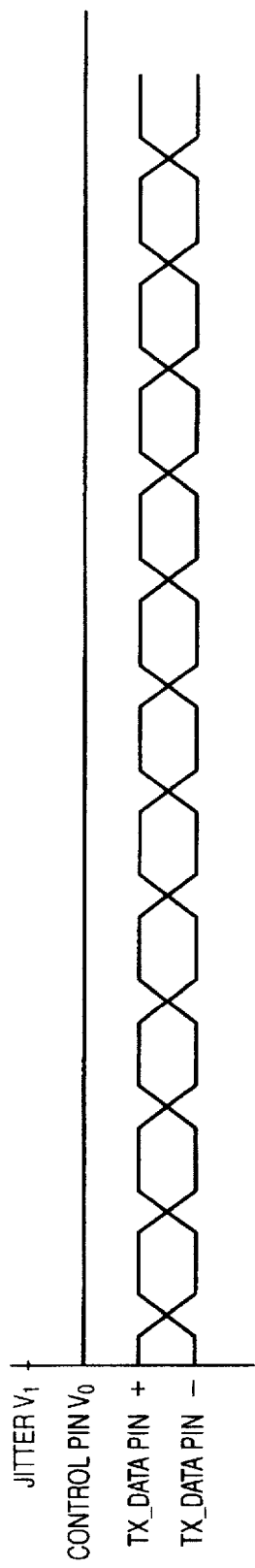
FIGS. 9A–9C are timing charts illustrating the operation of a transmitter in response to jitter according to the present invention.
Figure 9B:
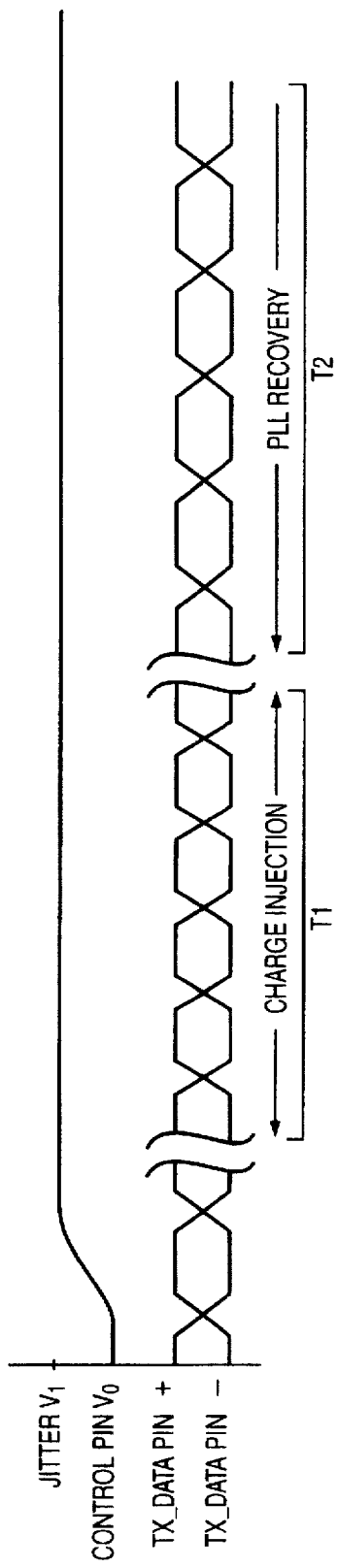
Figure 9C:
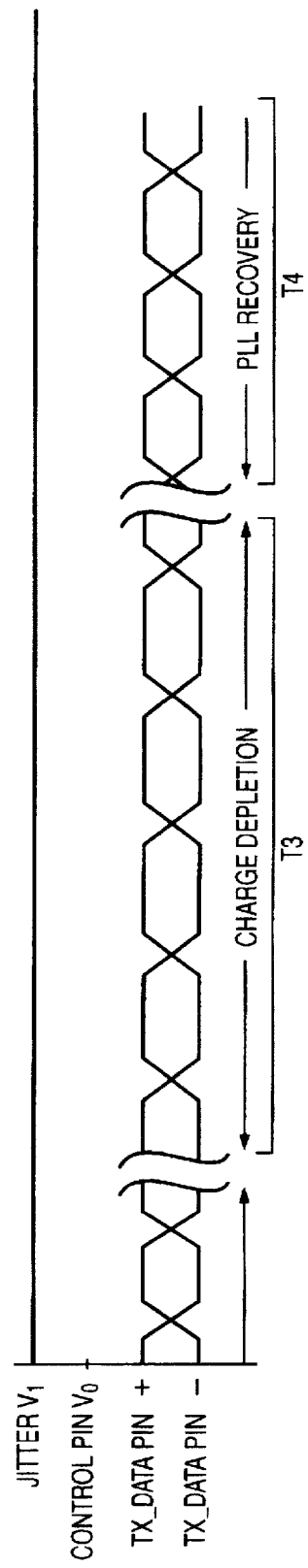

Turning now to FIGS. 9A–9C, timing charts illustrating the operation of a transmitter in response to jitter are depicted according to the present invention. FIG. 9A shows normal transmitter operation. Signals TX_DATA+ and TX_DATA− are signals at pins TX_DATA + and TX_DATA− for chip 31 in FIG. 4. Voltage $V_O$ is the voltage applied to jitter control pin for chip 31 in FIG. 4. In FIG. 9A, transmitter 47 in chip 31 clock serial data out with the voltage at the jitter control pin being held at $V_O$, indicating that no charge injection is being generated by charge pump circuit 25. Turning now to FIG. 9B, a voltage $V_1$ has been applied to the jitter control pin. In response to this change in voltage, a charge injection cycle in time period T1 begins in which a proportional to the voltage $V_1$ is pumped into voltage controlled oscillator 19 for some number of clocks. As a result, voltage controlled oscillator 19 speeds up. The number of clocks during which current is injected into voltage controlled oscillator 19 is determined by jitter counter 75 in programmable counter circuit 23. Time period T2 shows a PLL recovery cycle. During this cycle, charge pump circuit 25 no longer injects current into voltage controlled oscillator 19. As a result, PLL 11 is allowed to recover back to its normal transmission rate. This recovery time is determined by recovery counter 73 in programmable counter circuit 23.

Turning next to FIG. 9C, a charge depletion cycle is shown in time period T3 during which charge depletion is applied to voltage controlled oscillator 19 for a number of clocks determined by jitter counter 75 in programmable counter circuit 23. Voltage controlled oscillator 19 slows down during time period T3, causing the output signals to slow down. In time period T4, a PLL recovery cycle is depicted. During this time period, charge depletion is removed and PLL 11 recovers. As can be seen, during charge injection, the transmission speed increases, while during PLL recovery cycles, the transmission rate returns to normal speeds, and during charge depletion cycles, the transmission rate slows down. Thus, controlled jitter is induced into the PLL.

With the present invention, a method and apparatus is provided for measuring jitter tolerance of a high speed serial receiver to indicate how much jitter such a receiver can take before bit errors occur. The present invention allows jitter tolerance testing of a receiver without requiring external test equipment. Such a test may be accomplished by using external transmission medium connecting the transmitter to the receiver or by using a BIST mode. According to the present invention, the amount of jitter may be controlled externally during a test mode using a control signal. As a result, the present invention provides a method and apparatus for cheaply and efficiently measuring jitter tolerance of the receiver in a production test or lab environment without requiring expensive test equipment to induce and measure jitter. In addition, the present invention reduces the amount of test time required for testing whether a receiver meets acceptable levels of BER. The present invention provides these advantages by implementing a jitter injection circuit that is connected to the PLL of the transmitter.

Additionally, it would also be advantageous for the system manufacturer to utilize this convenient feature to easily evaluate the jitter tolerance of a serial data communication system or of a circuit board system.

While the invention has been particularly shown and described with reference to a preferred embodiment, it will be understood by those skilled in the art that various changes in form and detail may be made therein without departing from the spirit and scope of the invention.

What is claimed is:

1. A circuit in a semiconductor device having a transmitter and a receiver, the circuit comprising:

a phase-locked loop circuit, the phase-locked loop circuit having an input and an output;

a jitter injection circuit having an input and an output, wherein the jitter injection circuit generates an output signal at the output in response to an application of an input signal at the input, wherein the jitter injection circuit includes a charge pump circuit and the phase-locked loop circuit includes a voltage controlled oscillator, wherein an input of the voltage controlled oscillator is connected to an output of the charge pump circuit, which generates the output signal of the jitter injection circuit and wherein the frequency of the voltage controlled oscillator is altered by the output signal of the jitter rejection circuit; and wherein the jitter injection circuit induces a jitter into the phase-locked loop and the output of the phase-locked loop circuit is connected to the transmitter and controls a transmission of data at the transmitter, wherein the jitter generated by the jitter injection circuit and transmitted to the phase-locked loop circuit alters a phase and frequency at which the transmitter transmits data.

2. A circuit in a semiconductor device having a transmitter and a receiver, the circuit comprising:

a jitter injection circuit having an input and an output, wherein the jitter injection circuit generates an output signal at the output in response to an application of an input signal at the input, wherein the jitter injection circuit comprises:

a charge pump circuit having an input and an output, wherein the output of the charge pump circuit generates the output signal at the output of the jitter injection circuit;

a voltage to current converter having a voltage input and a current output, the current output being connected to the input of the charge pump signal, wherein the voltage to current converter controls the current level of the output signal at the output of the jitter injection circuit; and a programmable counter circuit connected to the charge pump circuit, wherein the programmable counter circuit controls the output signal; and a phase-locked loop circuit, the phase-locked loop circuit having an input and an output, wherein the jitter injection circuit induces jitter into the phase-locked loop circuit and the output of the phase-locked loop circuit is connected to the transmitter and controls a transmission of data at the transmitter, wherein the jitter generated by the jitter injection circuit and transmitted to the phase-locked loop circuit alters a phase and frequency at which the transmitter transmits data.

3. The circuit of claim 2, wherein the programmable counter circuit controls a timing of the output signal.

4. The circuit of claim 3, wherein the programmable counter circuit controls a frequency of the output signal.

5. The circuit of claim 2, wherein the phase-locked loop circuit comprises:

a phase detector and charge pump circuit having an input and an output, the input being connected to a reference clock signal;

a loop filter having an input and an output, the input being connected to the phase detector and charge pump circuit;

a voltage controlled oscillator having an input and an output, the input being connected to the output of the loop filter and the output of the charge pump circuit in the jitter injection circuit, wherein the output of the voltage controlled oscillator generates a clock signal at the output of the phase-locked loop circuit; and a divide by N circuit having an input and an output, the input being connected to the output of the voltage controlled oscillator and the output being connected to the input of the phase detector and charge pump circuit.

6. A semiconductor device comprising:

a jitter injection circuit having an input and an output;

a phase-locked loop circuit, the phase-locked loop circuit having an input and an output, the input being connected to the output of the jitter injection circuit, wherein the jitter injection circuit controls a clock signal generated at the output of the phase-locked loop circuit; and a transmitter having a first input and a second input, the first input being connected to a data signal and the second input being connected to the output of the phase-locked loop circuit, wherein the clock signal generated by the phase-locked loop circuit is altered in response to an input signal being applied to the input of the jitter injection circuit, wherein the jitter injection circuit includes a charge pump circuit and the phase-locked loop circuit includes a voltage controlled oscillator, wherein the charge pump circuit causes selective injection of current from the output of the jitter injection circuit into the voltage controlled oscillator, causing a phase and frequency of the voltage controlled oscillator to change, wherein a phase and frequency of the rate of data transmitted by the transmitter is altered.

7. The semiconductor device of claim 6, wherein the jitter injection circuit further includes a voltage to current converter circuit connected to the charge pump circuit, wherein the charge pump circuit is controlled by the voltage to current converter circuit.

8. The circuit of claim 6, wherein the jitter injection circuit comprises:

a charge pump circuit having an input and an output, wherein the output of the charge pump circuit generates the output signal at the output of the jitter injection circuit;

a voltage to current converter having a voltage input and a current output, the current output being connected to the input of the charge pump signal, wherein the voltage to current converter controls a current level of the output signal at the output of the jitter injection circuit; and a programmable counter circuit connected to the charge pump circuit, wherein the programmable counter circuit controls a timing and frequency of the output signal.

9. The circuit of claim 8, wherein the phase-locked loop circuit comprises:

a phase detector and charge pump having an input and an output, the input being connected to a reference clock signal;

a loop filter having an input and an output, the input being connected to the phase detector and charge pump;

a voltage controlled oscillator having an input and an output, the input being connected to the output of the loop filter and the output of the charge pump circuit in the jitter injection circuit, wherein the output of the voltage controlled oscillator generates a clock signal at the output of the phase-locked loop circuit and is connected to the second input of the transmitter; and a divide by N circuit having an input and an output, the input being connected to the output of the voltage controlled oscillator and the output being connected to the phase detector and charge pump.

10. A semiconductor device comprising:

a jitter injection circuit having an input and an output;

a phase-locked loop circuit, the phase-locked loop circuit having an input and an output, the input being connected to the output of the jitter injection circuit, wherein the jitter injection circuit controls a clock signal generated at the output of the phase-locked loop circuit; and a transmitter having a first input and a second input, the first input being connected to a data signal and the second input being connected to the output of the phase-locked loop circuit, wherein the clock signal generated by the phase-locked loop circuit is altered in response to an input signal being applied to the input of the jitter injection circuit, wherein the first input of the transmitter is for receiving parallel data and wherein the transmitter converts the parallel data into serial data and transmits the serial data at an output of the transmitter and further comprising a receiver having an input and an output, the input being connected to the output of the transmitter, wherein the receiver converts the serial data into parallel data and has an output for the parallel data.

11. The semiconductor circuit of claim 10, wherein the output of the transmitter and the input of the receiver are connected to each other by a off-chip connection.

12. The semiconductor device of claim 10, wherein the output of the transmitter is connected to the input of the receiver by a connection located within the semiconductor device.

13. A circuit for testing jitter in a system comprising:

a generation means for selectivity generating a signal at an output;

a phase-locked loop circuit having an input and an output, the input being connected to the output of the generation means, wherein a clock signal is generated at the output and the clock signal is selectively altered by the generation means; and a transmitter, wherein the transmitter has an input and an output and converts parallel data received at the input to serial data and wherein the output of the phase-locked loop circuit is connected to the transmitter and wherein the transmission of data by the transmitter is selectively altered by the generation means to cause jitter in the transmission of data by the transmitter;

a receiver for converting serial data to the parallel data, the receiver having an input and an output, the input of the receiver being connected to the transmitter, wherein parallel data is generated at the output of the receiver; and comparison means for comparing the parallel data received at the input of the transmitter to the parallel data generated at the output of the receiver and detecting differences between the parallel data received at the input of the transmitter and the parallel data generated at the output of the receiver.

14. The circuit of claim 13, wherein bit error rates are measured by the comparison means.

15. The circuit of claim 13, wherein the phase-locked loop comprises:
- a phase detector and charge pump circuit having an input and an output, the input being connected to a reference clock signal;
- a loop filter having an input and output, the input being connected to the phase detector and charge pump circuit;
- a voltage controlled oscillator having an input and an output, the input being connected to the output of the loop filter and the output of the charge pump circuit in the generation means, wherein the output generates a clock signal at the output of the phase-locked loop circuit; and
- a divide by N circuit having an input connected to the output of the voltage controlled oscillator and an output connected to the phase detector and charge pump circuit.

16. The circuit of claim 13, wherein the transmitter includes a serializer having an input for parallel data and the output of the phase-locked loop circuit is connected to the serializer.

17. The circuit of claim 13, wherein the circuit is located in a semiconductor device and the output of the transmitter is connected to the input of the receiver by a connection located on the semiconductor device.

18. The circuit of claim 13, wherein the first input and the output of the transmitter and the input and the output of the receiver are connected to each other by off-chip connections.

19. The circuit of claim 13, wherein the jitter is a sinusoidal jitter.

20. The circuit of claim 13, wherein the jitter includes a phase step jitter.

21. A circuit for testing jitter in a system comprising:
- a generation means for selectively generating a signal at an output;
- a phase-locked loop circuit having an input and an output, the input being connected to the output of the generation means, wherein a clock signal is generated at the output and the clock signal is selectively altered by the generation means; and
- a transmitter, wherein the output of the phase-locked loop circuit is connected to the transmitter and wherein transmission of data by the transmitter is selectively altered by the generation means to cause jitter in the transmission of data by the transmitter, wherein the generation means comprises a charge pump circuit connected the output for the selectively generated voltage signal and the phase-locked loop circuit includes a voltage controlled oscillator, wherein an output of the charge pump circuit is connected to an input of the voltage controlled oscillator, wherein a phase and frequency of the voltage controlled oscillator is altered by the selectively generated voltage signal such that phase and frequency at which the transmitter transmits data is altered.

22. A circuit for testing jitter in a system comprising:
- a generation means for selectively generating a signal at an output, wherein the generation means comprises:
  - a charge pump circuit, wherein the charge pump circuit generates the signal at the output of the generation means;
  - a voltage to current converter having a voltage input and a current output, wherein the output of the voltage to current converter is connected to the charge pump circuit and wherein the voltage to current converter controls a current level of the signal generated by the charge pump circuit; and
  - a programmable counter circuit connected to the charge pump circuit, wherein the programmable counter circuit controls a phase and frequency of the signal generated by the charge pump circuit;
- a phase-locked loop circuit having an input and an output, the input being connected to the output of the generation means, wherein a clock signal is generated at the output and the clock signal is selectively altered by the generation means; and
- a transmitter, wherein the output of the phase-locked loop circuit is connected to the transmitter and wherein transmission of data by the transmitter is selectively altered by the generation means to cause jitter in the transmission of data by the transmitter.

23. The circuit of claim 22, wherein the charge pump circuit selectively injects into and draws current from the phase-locked loop circuit.

* * * * *